United States Patent
Chih et al.

(10) Patent No.: US 8,196,072 B2
(45) Date of Patent: Jun. 5, 2012

(54) METHOD AND APPARATUS OF PATTERNING SEMICONDUCTOR DEVICE

(75) Inventors: Ming-Hui Chih, Luzhou (TW);
 Cheng-Kun Tsai, Hsinchu (TW);
 Wen-Chun Huang, Xi-Gang Xiang (TW); Ru-Gun Liu, Hsinchu (TW);
 Chii-Ping Chen, Taichung (TW);
 Jiing-Feng Yang, Zhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 178 days.

(21) Appl. No.: 12/750,873

(22) Filed: Mar. 31, 2010

(65) Prior Publication Data
US 2011/0245949 A1     Oct. 6, 2011

(51) Int. Cl.
 *G06F 17/50* (2006.01)
(52) U.S. Cl. .......................................... 716/55

(58) Field of Classification Search ............... 716/55
See application file for complete search history.

(56) References Cited

U.S. PATENT DOCUMENTS

| 2006/0286690 A1* | 12/2006 | Cao ............................ 438/14 |
| 2009/0232384 A1* | 9/2009 | Tu et al. ..................... 382/144 |
| 2011/0204470 A1* | 8/2011 | Cheng et al. ............... 257/499 |

* cited by examiner

*Primary Examiner* — Suresh Memula
(74) *Attorney, Agent, or Firm* — Haynes and Boone, LLP

(57) ABSTRACT

Provided is an apparatus for fabricating a semiconductor device. The apparatus includes a first photomask and a second photomask. The first photomask has a plurality of first features thereon, and the first photomask having a first global pattern density. The second photomask has a plurality of second features thereon, and the second photomask has a second global pattern density. The plurality of first and second features collectively define a layout image of a layer of the semiconductor device. The first and second global pattern densities have a predetermined ratio.

10 Claims, 4 Drawing Sheets

METHOD AND APPARATUS OF PATTERNING SEMICONDUCTOR DEVICE

TECHNICAL FIELD

The present disclosure relates generally to a semiconductor device, and more particularly, to a method of patterning the semiconductor device.

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. In the course of integrated circuit evolution, functional density (i.e., the number of interconnected devices per chip area) has generally increased while geometry size (i.e., the smallest component (or line) that can be created using a fabrication process) has decreased.

As the geometry sizes shrink, it may be difficult for conventional photolithography processes to form semiconductor features having these small geometry sizes. A double patterning method may be used to form the semiconductor features having small geometry sizes. However, existing double patterning methods suffer from load balancing issues, which may lead to inconsistent geometry sizes and may cause problems in later etching or polishing processes.

Therefore, while existing methods of patterning semiconductor devices have been generally adequate for their intended purposes, they have not been entirely satisfactory in every aspect.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

SUMMARY

Figure 1:
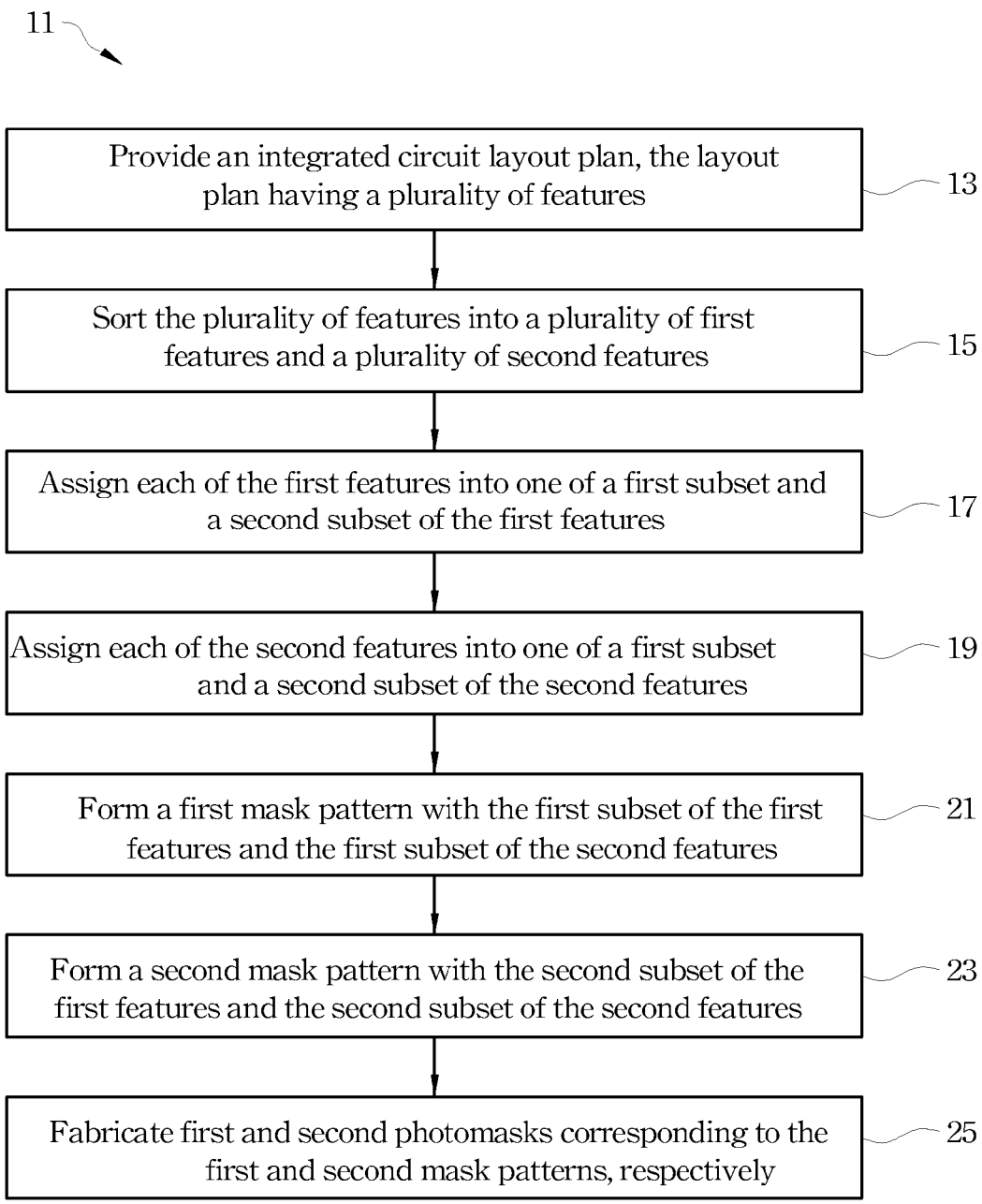
FIG. 1 is a flowchart illustrating a method for patterning a semiconductor device according to various aspects of the present disclosure.

One of the broader forms of the present disclosure involves a method of fabricating a semiconductor device. The method includes: providing an integrated circuit layout plan, the integrated circuit layout plan having a plurality of features; sorting the plurality of features into a plurality of first features and a plurality of second features, each of the first features being separated from adjacent first features at respective distances that are less than approximately X, and each of the second features being separated from adjacent second features at respective distances that are greater than approximately X; assigning each of the first features into one of a first subset and a second subset of the first features; assigning each of the second features into one of a first subset and a second subset of the second features; forming a first mask pattern with the first subset of the first features and the first subset of the second features, the first mask pattern having a first global pattern density; forming a second mask pattern with the second subset of the first features and the second subset of the second features, the second mask pattern having a second global pattern density; and fabricating first and second photomasks corresponding to the first and second mask patterns, respectively; wherein the assigning each of the first features is carried out in a manner so that a group of the first features in the first subset interleave with a group of the first features in the second subset, and the assigning each of the first features and the assigning each of the second features are carried out in a manner so that the first and second global pattern densities approach a predetermined ratio.

Another of the broader forms of the present disclosure involves a method of fabricating a semiconductor device. The method includes: providing a layout design for the semiconductor device, the layout design containing a plurality of features; categorizing the plurality of features into a plurality of first features and a plurality of second features, each of the first features being spaced apart from adjacent first features at respective distances that are less than a predetermined distance, and each of the second features being spaced apart from adjacent second features at respective distances that are greater than the predetermined distance; sorting the first features into first and second subsets of features in a manner so that each of the features in the first and second subsets is spaced apart from adjacent features in the respective subset at respective distances that are greater than the predetermined distance; sorting the second features into third and fourth subsets of features in a manner so that a number of features in the third subset is free of substantial deviation from a number of features in the fourth subset; forming a first mask pattern with the first and third subsets of features; forming a second mask pattern with the second and fourth subsets of features; and fabricating first and second photomasks with the first and second mask patterns, respectively; wherein the predetermined distance is a function of: a critical dimension of a semiconductor fabrication process; a wavelength of a radiation wave used in a photolithography process of the semiconductor fabrication process; a numerical aperture of a lens used in the photolithography process; and a process compensation factor.

Yet another of the broader forms of the present disclosure involves an apparatus for fabricating a semiconductor device. The apparatus includes: a first photomask having a plurality of first features thereon, the first photomask having a first global pattern density; and a second photomask having a plurality of second features thereon, the second photomask having a second global pattern density; wherein the plurality of first and second features collectively define a layout image of a layer of the semiconductor device, and wherein the first and second global pattern densities have a predetermined ratio.

DETAILED DESCRIPTION

It is to be understood that the following disclosure provides many different embodiments, or examples, for implementing different features of the invention. Specific examples of components and arrangements are described below to simplify the present disclosure. These are, of course, merely examples and are not intended to be limiting. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for the sake of simplicity and clarity.

Illustrated in FIG. 1 is a flowchart of a method 11 of patterning a semiconductor device according to various aspects of the present disclosure. The method 11 begins with block 13 in which an integrated circuit layout plan is provided. The integrated circuit layout plan has a plurality of features. The method 11 continues with block 13 in which the plurality of features are sorted into a plurality of first features and a plurality of second features. Each of the first features are separated from adjacent first features at respective distances that are less than approximately X, and each of the second features are separated from adjacent features at respective distances that are greater than approximately X. The method 11 continues with block 17 in which each of the first features are assigned into one of a first subset and a second subset of the first features. The method 11 continues with block 19 in which each of the second features are assigned into one of a first subset and a second subset of the second features. The method 11 continues with block 21 in which a first mask pattern is formed with the first subset of the first features and the first subset of the second features. The first mask pattern has a first global pattern density. The method 11 continues with block 23 in which a second mask pattern is formed with the second subset of the first features and the second subset of the second features. The second mask pattern has a second global pattern density. The method 11 continues with block 25 in which first and second photomasks are fabricated. The first and second photomasks correspond to the first and second mask patterns, respectively. In accordance with the method 11, block 17 is carried out in a manner so that a group of the first features in the first subset interleave with a group of the first features in the second subset, and block 17 and 19 are carried out in a manner so that the first and second global pattern densities approach a predetermined ratio.

Figure 2:
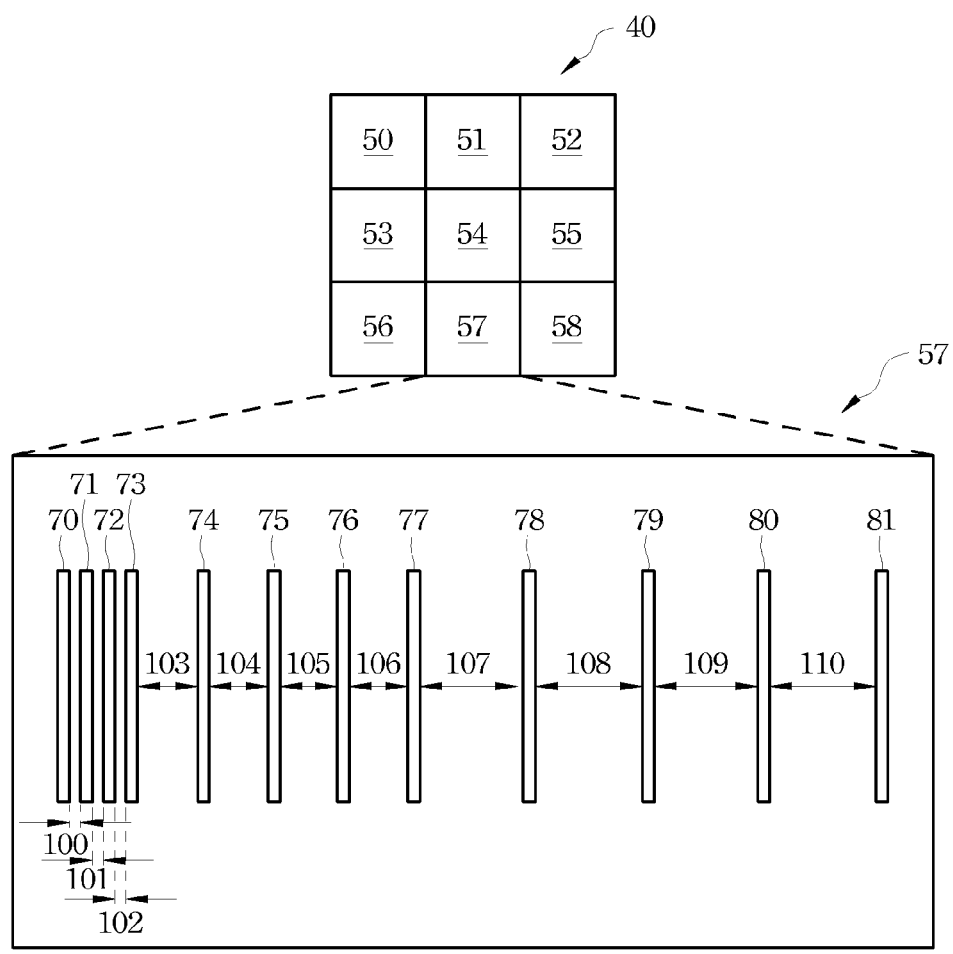
FIG. 2 illustrate a fragmentary top view of a layer of a physical layout plan of the semiconductor device.

After a semiconductor device such as an integrated circuit has been designed, layout engineers generate a physical layout plan (or layout design) of the integrated circuit. The physical layout plan may contain a plurality of different layout layers that each contain a plurality of semiconductor features. For purposes of illustration, a fragmentary top view of an exemplary layout layer 40 of such physical layout plan of an integrated circuit is shown in FIG. 2. The layout layer 40 includes a plurality of local regions, for example, local regions 50-58. To facilitate the ensuing discussions, the top view of the local region 57 is shown in more detail. The local region 57 has semiconductor features 70-81. Distances 100-110 separate features 70-71, 71-72, 72-73, 73-74, 74-75, 75-76, 76-77, 77-78, 78-79, 79-80, and 80-81, respectively, as illustrated in FIG. 2. In the embodiment shown, the features 70-73 are approximately evenly spaced apart, meaning the distances 100-102 are approximately equal to one another. The features 73-77 are evenly spaced apart, meaning the distances 103-106 are approximately equal to one another. The features 77-81 are evenly spaced apart, meaning the distances 107-110 are approximately equal to one another. In other embodiments, the features 73-77, 77-81, and 107-110 may not be evenly spaced apart.

The distances 100-102 are smaller than a predetermined distance X. X represents the finest or smallest resolution (smallest spacing) that can be achieved by a photolithography process in a given semiconductor fabrication technology generation. In other words, X is the smallest distance between adjacent semiconductor features that can be formed by the photolithography process without shorting these adjacent semiconductor features together. X varies depending on a variety of factors, including a critical dimension (CD) of a semiconductor fabrication process, a wavelength (λ) of a radiation wave (such as light) used in the photolithography process, a numerical aperture (NA) of a lens used in the photolithography process, and a process compensation factor (K). The critical dimension CD is the smallest feature size that can be formed by the photolithography process of the semiconductor fabrication process. The process compensation factor K has a numerical value and is a function of fabrication process parameters such as fabrication cost, acceptable deviation, semiconductor fabrication tool limitations, etc. The process compensation factor K can be tuned or changed. For example, K can be reset if a new photolithography tool such as a scanner is used, or if a new type of photoresist is applied, or that a new etching technology is employed. As an example, K may be in a range that varies from approximately 0.2 to approximately 0.5. Once the values of λ, K, NA, and CD are determined, the following equation may be used to calculate X:

$$X = (2 * \lambda * K/NA) - CD$$

In an embodiment, the value of X in a 22-nanometer (nm) fabrication technology generation may be in a range that varies from about 50 nm to about 80 nm.

The distances 103-106 are greater than the predetermined distance X, but are smaller than a predetermined distance Y, where Y is in a range that varies from approximately 5 times the CD of the semiconductor fabrication process to approximately 10 times the CD. In an embodiment, Y is in a range that varies from approximately 150 nm to approximately 300 nm. The distances 107-110 are greater than the predetermined distance Y.

It is understood that the number of local regions 50-58 of the layout layer 40 and the number of semiconductor features 70-81 as well as their respective sizes and shapes are merely exemplary. The layer 40 in other embodiments may have a different number of local regions, and each local region may have a different number of semiconductor features with different sizes and shapes.

Since the distances 100-102 between the respective features 70-71, 71-72, and 72-73 are smaller than the smallest resolution X of the semiconductor fabrication process, a patterning method known as double patterning may be used to form the features 70-73. Double patterning involves two stages of patterning so as to expand the effective spacing between adjacent features. As an example, in the embodiment shown in FIG. 2, the features 70 and 72 would be formed on one photomask (not illustrated), and the features 71 and 73 would be formed on a different photomask (not illustrated). A semiconductor wafer (not illustrated) is then patterned using the photomask having the features 70 and 72, so as to form semiconductor components that resemble the image patterns of the features 70 and 72. In other words, the image patterns of the features 70 and 72 are transferred onto the semiconductor wafer. The effective spacing or distance between the features 70 and 72 is approximately equal to a sum of the distance 100, the distance 101, and the size of the feature 71 measured along the same direction that the distances 100-102 are measured. Thus, the effective distance between the features 70 and 72 may be greater than X and can thus be achieved by the semiconductor fabrication technology.

Subsequently, the semiconductor wafer is patterned using the photomask having the features 71 and 73, so as to form semiconductor components that resemble the image patterns of the features 71 and 73. In other words, the image patterns of the features 71 and 73 are transferred onto the semiconductor wafer after the image patterns of the features 70 and 72 have already been transferred. For reasons similar to those discussed above, the features 71 and 73 have a greater effective distance between them and may therefore be capable of being formed by the semiconductor fabrication technology.

It is understood that the order in which the photomasks are used is not important. In an alternative embodiment, the photomask having the features 71 and 73 may be used to pattern the semiconductor wafer before the photomask having the features 70 and 72 is used. In any case, after the two stages of photolithography (each involving the use of a different photomask) are completed, the image patterns of the features 70-73 may be transferred onto a single layer of the semiconductor wafer.

However, one drawback of existing double patterning methods is that they do not take the loading effect of the rest of the features 74-81 into consideration when designing the above-mentioned photomasks. The features 74-81 have adequate spacing between them, therefore double patterning is not necessary to form these features. As a result, although the features 70-73 are distributed or split between two photomasks, the features 74-81 are often times formed on a single photomask for purposes of convenience and simplicity. When this is done, a global pattern density—the total area of the features on a photomask divided by the total area of the photomask—of one of the photomasks is much greater than the global pattern density of the other photomask. Furthermore, local area densities—the total areas of the features in different local areas of the photomask (such as local regions 50-58) divided by the total area of each of the local areas—do not match one another. In addition, the local pattern densities of the corresponding local areas between the two photomasks do no match one another either. As a result, the semiconductor components formed on the wafer may have uneven sizes and/or depths, which may adversely affect later etching and polishing processes and is therefore undesirable. To solve this load balancing problem, the present disclosure uses an algorithm to assign semiconductor features to different photomasks. Four embodiments of the algorithm are respectively discussed below in detail. Each of the algorithms may be implemented as computer programs, sometimes also referred to as "recipes". For the sake of illustration, the features 70-81 of the local region 57 are used as exemplary semiconductor features in the ensuing discussions.

The first embodiment of the algorithm may be referred to as a "random assignment embodiment". In the random assignment embodiment, the algorithm first sorts each of the features 70-81 into one of two categories, depending on each feature's spacing or distance from adjacent features. In particular, if a feature's spacing or distance from adjacent features is less than X (the smallest resolution of a given semiconductor fabrication process), that feature is sorted into category A. The remaining features are sorted into category B. In other words, features that are disposed close enough to adjacent features so as to require double patterning are sorted into category A, and the features that do not need double patterning are sorted into category B. Here, the features 70-73 are sorted into category A, and the features 74-81 are sorted into category B. It may be said that this sorting process is performed based on the criteria or concern of lithography resolution.

Next, the algorithm assigns the features 70-73 in category A into two different subsets A and B in a periodic fashion. As an example, the features 70 and 72 are assigned into subset A, and the features 71 and 73 are assigned into subset B. Alternatively, the features 71 and 73 may be assigned into subset A, and the features 70 and 72 may be assigned into subset B. Another way of looking at this periodic assignment is that the features 70 and 72 in subset A are periodically interleaved with the features 71 and 73 in subset B. The process of assigning the features 70-73 into different subsets A and B may also be referred to as a part of a coloring process—each of the features 70-73 is given a conceptual "color" depending on its assignment into the subset A or the subset B. The features 70 and 72 in subset A have a different "color" than the features 71 and 73 in subset B. This coloring process is also performed for the other features 74-81, as discussed below.

Either following the assignment of the features 70-73 in category A, or being performed concurrently, the features 74-81 are randomly assigned into two different subsets C and D. As an example, the features 74, 77, 79, and 80 are assigned into subset C, and the features 75, 76, 78, and 81 are assigned into subset D. As another example, the features 75, 77, 78 and 80 are assigned into subset C, and the features 74, 76, 79 and 81 are assigned into subset D. In other words, since the assignment of the features 74-81 are performed in a random fashion, there are numerous other configurations of assignment. These other configurations are not discussed herein for the sake of simplicity and brevity. The process of assigning the features 74-81 into different subsets C and D is a part of the coloring process. Here, the "coloring" of features 74-81 into the subsets C or D is performed based on the criteria or concern of loading balance between the photomasks that will contain these features. Further, in the process of assignment discussed above, each of the features 70-81 may be assigned as a whole, or may alternatively be split up into two or more sub-features and then assigned.

Figure 3A:
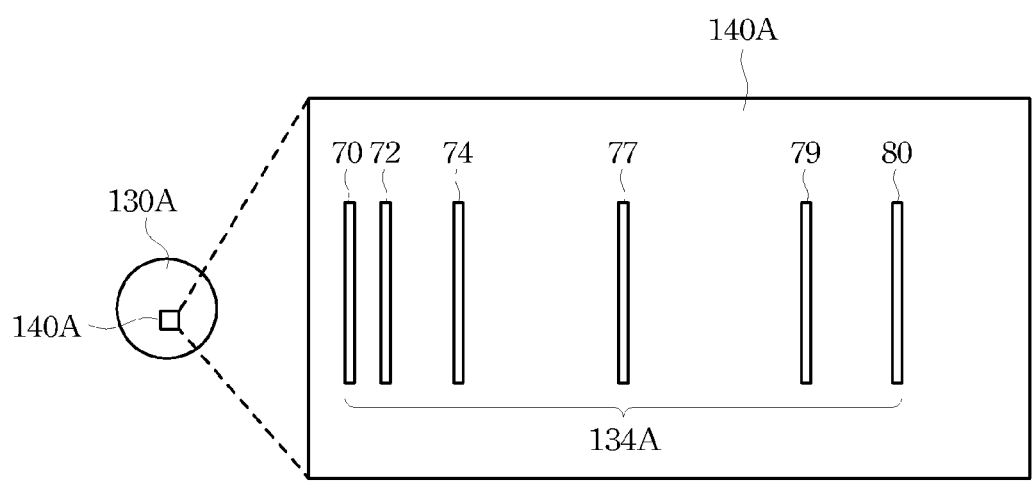
FIGS. 3A and 3B illustrate fragmentary top views of two photomasks fabricated in accordance with one embodiment of the method of FIG. 1.
Figure 3B:
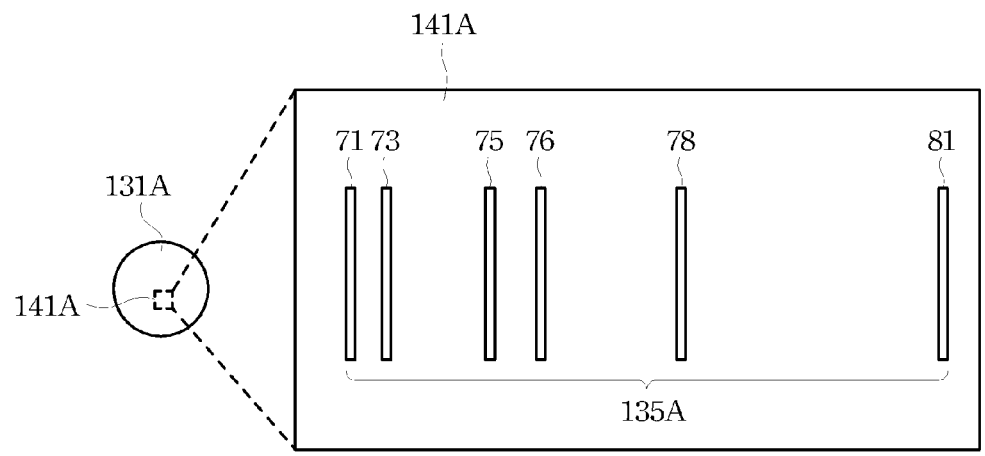

Referring now to FIGS. 3A and 3B, fragmentary top views of photomasks 130A and 131A are illustrated, respectively. In accordance with the algorithm, the features 70 and 72 in subset A and the features 74, 77, 79, and 80 in subset C collectively form a mask pattern 134A, and the features 71 and 73 in subset B and the features 75, 76, 78, and 81 in subset D collectively form a mask pattern 135A. The photomask 130A is fabricated using the mask pattern 134A, where the mask pattern 134A is disposed in a local area 140A on the photomask 130A. The photomask 131A is fabricated using the mask pattern 135A, where the mask pattern 135A is disposed in a local area 141A on the photomask 131A. The local areas 140A and 141A each correspond to the local area 57 (FIG. 2) of the layer 40 and would have been aligned with each other when the photomasks 130A and 131A are used to pattern a semiconductor wafer (not illustrated) in a later lithography process. It is also understood that the photomasks 130A and 131A each contain a plurality of other local areas (e.g. local areas that would correspond with the local areas 50-56 and 58 of FIG. 2). These local areas are not shown for the sake of simplicity, but it is understood that each local area may contain a plurality of features that have been assigned or split in accordance with the algorithm as discussed above.

As is illustrated in FIGS. 3A and 3B, the spacing between the features 70-81 on each of the photomasks 130A and 131A is greater as compared to the spacing between the features in the local area 57 as illustrated in FIG. 2. Consequently, the features, particularly the features 70-73 are easier to form even with the resolution limitations of the photolithography process. Further, the algorithm can be designed and carried out in a manner so as to:

1. optimize the matching between the global pattern densities of the photomasks 130A and 131A;
2. optimize the matching between the local pattern densities of the local area 140A on the photomask 130A and the local area 141A on the photomask 131A;
3. optimize the matching between local pattern densities of the local area 140A and the local pattern densities of other local areas on the photomask 130A; and
4. optimize the matching between local pattern densities of the local area 141A and the local pattern densities of other local areas on the photomask 131A.

Alternatively stated, in each of the global/local pattern density matching scenarios discussed above, the two pattern densities that need to be optimally matched are functions of each other, or correlated with each other. As an example, the global pattern density of the photomask 130A and the global pattern density of the photomask 131A have a ratio that is tuned to be approaching 1:1, where the ratio is tuned through the design and implementation of the algorithm. In other words, a difference between the global pattern density of the photomask 130A and the global pattern density of the photomask 131A is less a predetermined value, and the predetermined value is approximately 0 when the ratio between the two global pattern densities is approximately 1:1. Even in cases where it is difficult for the ratio to be tuned to be approximately 1:1, the ratio can still be tuned so that it does not substantially deviate from 1:1, meaning that the global pattern density of the photomask 130A is free of substantial deviation from the global pattern density of the photomask 131A and vice versa. To ensure that these global pattern densities do not substantially deviate from each other, the ratio discussed above is tuned to be within a predetermined percentage from a ratio of 1:1, where the predetermined percentage is specified by design and manufacturing requirements to achieve proper load balancing. In an embodiment, to maximize global pattern density matching, the number of features assigned to the photomask 130A does not substantially deviate from the number of features assigned to the photomask 131A. 2Similarly, in some cases, the ratio of the various local pattern densities discussed above may be tuned to approach approximately 1:1 as well. In other cases, due to the layout plan of the features in the layer 40 (FIG. 2) of the integrated circuit, a ratio of 1:1 between local pattern densities may not be achievable, but the algorithm can still be used to minimize the difference between the local pattern densities, so that these local pattern densities are free of substantial deviations from one another in a manner similar to that of the global pattern densities.

Referring back to FIG. 2, another embodiment of the algorithm is discussed. This embodiment may be referred to as a "multi-stage decomposition" embodiment. In this embodiment, the algorithm includes two stages of processing, each having a different programming "recipe". In the first stage, using a first recipe, the algorithm sorts the features 70-81 into categories A and B in a similar fashion as the random assignment embodiment of the algorithm discussed above. Thus, the features 70-73 are sorted into category A, and the features 74-81 are sorted into category B. Then the features 70-73 are assigned into subsets A and B in a similar fashion as the random assignment embodiment of the algorithm. Thus, the features 70 and 72 are assigned into subset A, and the features 71 and 73 are assigned into subset B.

The algorithm then proceeds to the second stage. In the second stage, using a second recipe, the algorithm splits the remaining features 74-81 into two groups. In one group, each of the features is spaced apart from adjacent features at a distance that is less than the predetermined distance Y (recall that Y is in a range that varies from approximately 5 times the CD to approximately 10 times the CD). In another group, each of the features is spaced apart from adjacent features at a distance that is greater than Y. Thus, the features 74-77 are split into one group, and the features 78-81 are split into another group. Thereafter, the features 74-77 are periodically assigned into subsets C and D. As an example, the features 74 and 76 are assigned into subset C, and the features 75 and 77 are assigned into subset D. In other words, the features 74 and 76 in the subset C are periodically interleaved with the features 75 and 77 in the subset D. The features 78 and 81 are randomly assigned into subsets E and F. As an example, the features 78 and 81 are assigned into the subset E, and the features 79 and 80 are assigned into the subset F. Alternatively, the features 78 and 79 are assigned into the subset E, and the features 80 and 81 are assigned into the subset F.

Figure 4A:
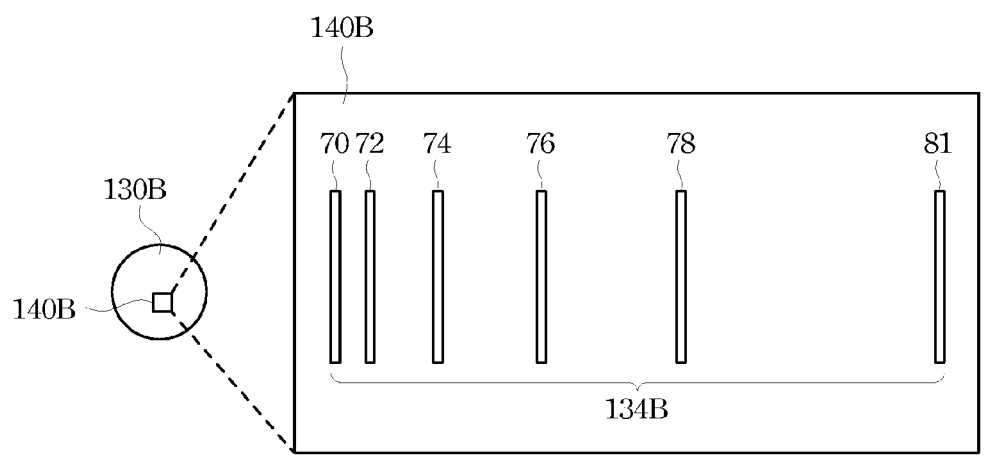
FIGS. 4A and 4B illustrate fragmentary top views of two photomasks fabricated in accordance with other embodiments of the method of FIG. 1.
Figure 4B:
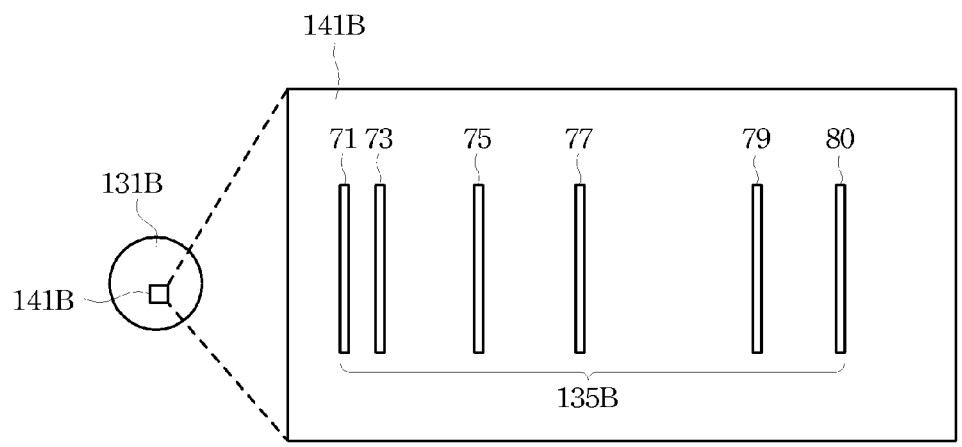

Referring now to FIGS. 4A and 4B, fragmentary top views of photomasks 130B and 131B are illustrated, respectively. In accordance with the multi-stage decomposition algorithm, a mask pattern 134B is formed collectively by the features 70 and 72 in subset A, the features 74 and 76 in subset C, and the features 78 and 81 in subset E, and a mask pattern 135B is formed collectively by the features 71 and 73 in subset B, the features 75 and 77 in subset D, and the features 79 and 80 in subset F. The photomask 130B is fabricated using the mask pattern 134B, where the mask pattern 134B is disposed in a local area 140B on the photomask 130B. The photomask 131B is fabricated using the mask pattern 135B, where the mask pattern 135B is disposed in a local area 141B on the photomask 131B. The local areas 140B and 141B each correspond to the local area 57 (FIG. 2) of the layer 40 and would have been aligned with each other when the photomasks 130B and 131B are used to pattern a semiconductor wafer (not illustrated) in a later lithography process. It is also understood that the photomasks 130B-131B each contain a plurality of other local areas (e.g. local areas that would correspond with the local areas 50-56 and 58 of FIG. 2). These local areas are not shown for the sake of simplicity, but it is understood that each local area may contain a plurality of features that have been assigned or split in accordance with the algorithm as discussed above.

The multi-stage decomposition embodiment of the algorithm offers most of the advantages discussed above in association with the random assignment embodiment of the algorithm, though it is understood that different embodiments of the algorithm may offer different advantages, and that no advantage is required for all embodiments. In addition, the periodic assignment of the features 75-78 (which have spacing less than the predetermined distance Y) results in photomasks 130B and 131B that have more matched and balanced global pattern densities and therefore leads to better performance for the later fabrication processes. However, since the algorithm in this multi-stage decomposition embodiment is carried out in two stages, the actual run time may be longer than the run time of the random assignment embodiment of the algorithm.

Referring back to FIG. 2, yet another embodiment of the algorithm is discussed. This embodiment may be referred to as a "multi-criterion decomposition" embodiment. This embodiment of the algorithm is similar to the multi-stage decomposition embodiment discussed above, except that the algorithm is carried out in one single stage using a single programming recipe, as opposed to the two stages using two different programming recipes in the multi-stage decomposition embodiment. The criteria used to determine the sorting and assigning of the features 70-81 in this embodiment are substantially similar to the criteria in the multi-stage decomposition embodiment. For purposes of consistency and simplicity, the multi-criterion decomposition algorithm is carried out in a manner so that the resulting photomasks 130B and 131B have the same respective mask patterns 134B and 135B as the multi-stage decomposition embodiment, which are illustrated in FIGS. 4A and 4B. The multi-criterion decomposition embodiment achieves most of the advantages of the multi-stage decomposition embodiment discussed above, and offers an additional advantage of reduced run time, since it is carried out in a single stage using a single programming recipe. However, the programming recipe in this embodiment requires more complex programming instructions or programming routines, and thus may lead to longer initial development time and costs. In other words, a trade off exists between run time and initial development time and costs in selecting the multi-stage decomposition embodiment or the multi-criterion decomposition embodiment of the algorithm.

Referring back to FIG. 2, one more embodiment of the algorithm is discussed. This embodiment may be referred to as a "mixing type decomposition" embodiment. This embodiment of the algorithm is similar to the multi-stage decomposition embodiment and the multi-criterion decomposition embodiment discussed above. Unlike the multi-stage decomposition embodiment, however, the algorithm in the mixing type decomposition embodiment is carried out in one stage. Further, unlike the other embodiments, the algorithm here is carried out using two computerized virtual layers (also referred to as internal layers) so as to reduce programming complexities and initial development time and costs. More specifically, the layout plan of the layout layer 40 is contained in a computer file known as a GDS type file. The features contained by the GDS file, such as features 70-81, are divided using the algorithm and are put on two different computerized virtual layers A and B. These computerized virtual layers A and B are separate and independent from each other. In accordance with this mixing type embodiment, the features that have spacing or distance less than X are put on one computerized virtual layer, for example computerized virtual layer A, and the other features are put on the other computerized virtual layer B. Here, the features 70-73 are put in the computerized virtual layer A, while the features 74-81 are put in the computerized virtual layer B. In comparison, the "random assignment" embodiment, the "multi-stage decomposition embodiment", and the "multi-criterion decomposition" embodiment each utilize only one computerized virtual layer (or one internal layer), in the features are divided and assigned.

In the "mixing type decomposition" embodiment, the features 70-73 in the computerized virtual layer A are further assigned into the subsets A and B in a manner similar to the multi-stage and multi-criterion decomposition embodiments discussed above, and the features 74-81 in the computerized virtual layer B are further assigned into the subsets C, D, E, and F in a manner similar to the multi-stage and multi-criterion decomposition embodiments discussed above.

Referring to FIGS. 4A and 4B, before the photomasks 130B and 131B are fabricated, the subset A in the computerized virtual layer A is combined or merged with the subsets C and E in the computerized virtual layer B to form the mask pattern 134B, and the subset B in the computerized virtual layer A is combined or merged with the subsets D and F in the computerized virtual layer B to form the mask pattern 135B. In other words, the mask pattern 134B is formed collectively by the subsets A, C, and E, and another mask pattern 135B is formed collectively by the subsets B, D, and F. Thereafter, the photomask 130B is fabricated using the mask pattern 134B, and the photomask 131B is fabricated using the mask pattern 135B. Since the mixing type decomposition embodiment of the algorithm is carried out using a single stage, it does not prolong actual run time. Also, since the features 70-81 are segregated into two separate and independent computerized virtual layers, the programming complexities are reduced, which decreases initial development time and costs.

Figure 5:
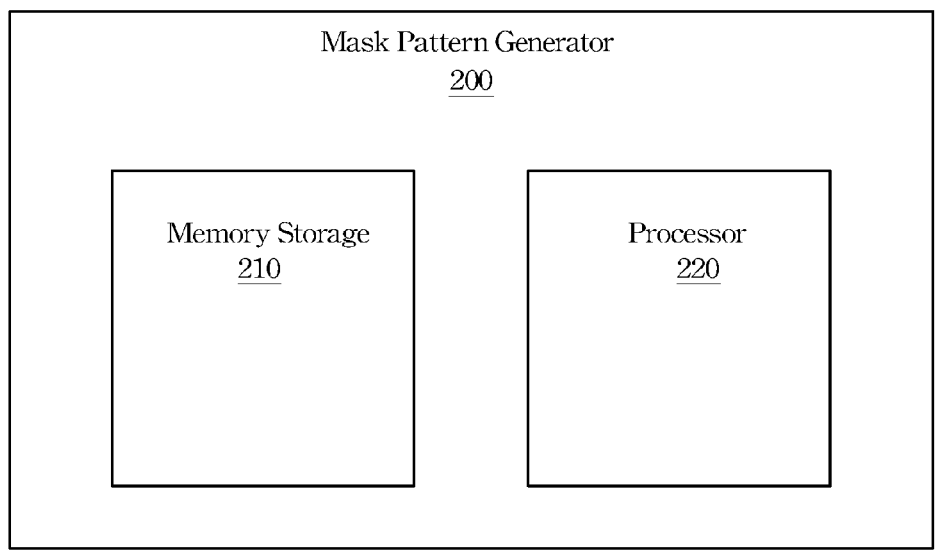
FIG. 5 is a simplified diagrammatic view of a machine that can be used to generate patterns for the photomasks of FIGS. 3 and 4.

FIG. 5 is a simplified diagrammatic view of a mask pattern generator 200. The mask pattern generator 200 is a machine that can be used to generate mask patterns for photomasks, for example the mask patterns 134 and 135 of FIGS. 3 and 4, so that the photomasks 130 and 131 may be formed having those patterns. The mask pattern generator 200 includes a memory storage component 210 and a processor component 220. The memory storage component 210 stores instructions that can be executed by the processor 220. The instructions contain algorithms used to produce the mask patterns 134 and 135 as discussed above with reference to FIGS. 2-4. The processor 220 runs those instructions and generates the mask patterns 134 and 135. The generated mask patterns 134 and 135 may be stored in the memory storage 210. These generated mask patterns 134 and 135 may be retrieved later to fabricate the photomask 130 and 131 of FIGS. 3 and 4.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method of fabricating a semiconductor device, comprising:

providing an integrated circuit layout plan, the integrated circuit layout plan having a plurality of features;

sorting the plurality of features into a plurality of first features and a plurality of second features, each of the first features being separated from adjacent first features at respective distances that are less than approximately X, and each of the second features being separated from adjacent second features at respective distances that are greater than approximately X;

assigning each of the first features into one of a first subset and a second subset of the first features;

assigning each of the second features into one of a first subset and a second subset of the second features;

forming a first mask pattern with the first subset of the first features and the first subset of the second features, the first mask pattern having a first global pattern density; and forming a second mask pattern with the second subset of the first features and the second subset of the second features, the second mask pattern having a second global pattern density;

wherein the assigning each of the first features is carried out in a manner so that a group of the first features in the first subset interleave with a group of the first features in the second subset, and the assigning each of the first features and the assigning each of the second features are carried out in a manner so that a difference between the first and second global pattern densities is less than a predetermined value.

2. The method of claim 1, wherein the assigning each of the first features and the assigning each of the second features are carried out in a manner so that the predetermined value approaches 0.

3. The method of claim 1, wherein:
the assigning each of the first features is carried out so that the first mask pattern has a plurality of first local pattern densities measured at a plurality of predefined first local areas of the first mask pattern;
the assigning each of the second features is carried out so that the second mask pattern has a plurality of second local pattern densities measured at a plurality of predefined second local areas of the second mask pattern, each of the predefined second local areas corresponding with one of the predefined first local areas;
each of the first local area densities is free of substantial deviation from other first local area densities; and
each of the second local area densities is free of substantial deviation from other second local area densities.

4. The method of claim 1, further including fabricating first and second photomasks corresponding to the first and second mask patterns, respectively; and wherein the sorting the plurality of features is carried out so that X is a function of a parameter selected from the group consisting of:
a critical dimension of a semiconductor fabrication process;
a wavelength of a radiation wave used in a photolithography process of the semiconductor fabrication process;
a numerical aperture of a lens used in the photolithography process; and
a process compensation factor.

5. The method of claim 1, wherein:
the assigning each of the first features includes periodically assigning each of the first features into one of the first subset and the second subset of the first features; and
the assigning each of the second features includes randomly assigning each of the second features into one of the first subset and the second subset of the second features.

6. The method of claim 1, wherein the sorting the plurality of features is carried out so that the plurality of second features include first and second groups of second features, the first group of second features being spaced apart by distances that are less than a predetermined distance, the second group of second features being spaced apart by distances that are greater than the predetermined distance, and wherein the assigning each of the first features includes periodically assigning each of the first features into one of the first subset and the second subset of the first features.

7. The method of claim 6, wherein the predetermined distance is in a range that varies from approximately 5 times a critical dimension of a semiconductor fabrication process to approximately 10 times the critical dimension.

8. The method of claim 6, wherein the assigning each of the second features includes periodically assigning the first group of second features and randomly assigning the second group of second features.

9. The method of claim 1, further including creating first and second computerized internal layers that are separate and independent of each other, and wherein the assigning each of the first features is performed in the first computerized internal layer, and wherein the assigning each of the second features is performed in the second computerized internal layer.

10. The method of claim 1, wherein the sorting the plurality of features is carried out so that the plurality of first features are approximately evenly spaced apart by a first distance, and wherein the assigning each of the first features is carried out in a manner so that the first features in the first subset are approximately evenly spaced apart by a second distance, and wherein the second distance is approximately equal to a sum of twice the first distance and a width of one of the first features, the width being measured in a same direction as the first distance.

* * * * *